United States Patent
Takahashi

(10) Patent No.: US 7,361,043 B2
(45) Date of Patent: Apr. 22, 2008

(54) APPARATUS INCLUDING CARD ELEMENT, DEVICE INSERTED INTO APPARATUS AND A METHOD FOR CONNECTING OR DISCONNECTING THE CARD ELEMENT

(75) Inventor: Isao Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/713,672

(22) Filed: Mar. 5, 2007

(65) Prior Publication Data
US 2007/0218711 A1 Sep. 20, 2007

(30) Foreign Application Priority Data
Mar. 14, 2006 (JP) ............................. 2006-069060
Feb. 23, 2007 (JP) ............................. 2007-043370

(51) Int. Cl.
*H01R 13/62* (2006.01)
(52) U.S. Cl. .................. 439/326; 439/61; 439/954
(58) Field of Classification Search ............... 439/954, 439/61–62, 67, 326
See application file for complete search history.

(56) References Cited

U.S. PATENT DOCUMENTS

| 4,862,400 A | * | 8/1989 | Selbrede | 361/683 |
| 5,511,985 A | * | 4/1996 | Noschese et al. | 439/157 |
| 7,186,145 B1 | * | 3/2007 | Feldman et al. | 439/638 |

FOREIGN PATENT DOCUMENTS

| JP | 11-340660 | 12/1999 |
| JP | 2002-512454 A | 4/2002 |

\* cited by examiner

*Primary Examiner*—Truc Nguyen
(74) *Attorney, Agent, or Firm*—Young & Thompson

(57) ABSTRACT

An apparatus including a substrate and a card element to be installed on the substrate includes a first plane which inclines at a predetermined angle with respect to the substrate; a second plane which is provided on the card element, inclines at the angle with respect to the substrate, and slides on the first plane in a direction corresponding to the angle; a first terminal which is provided on the substrate, and inclines at the angle with respect to the substrate; and a second terminal which is provided on the card element, inclines at the angle with respect to the substrate, and connects with the first terminal.

15 Claims, 11 Drawing Sheets

25,26 : SLOT
27 : PROJECTION
28 : GUIDING PART

Fig. 1A
Fig. 1B
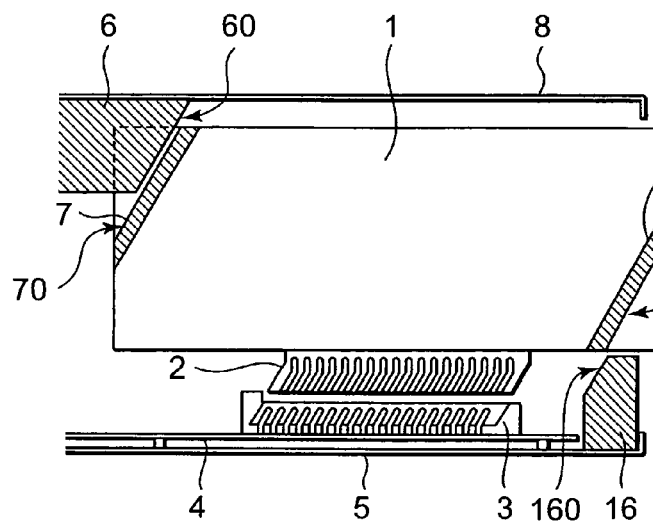
SIDE VIEW (SECTIONAL VIEW)
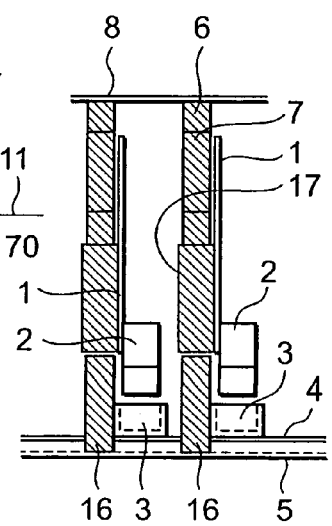
FRONT VIEW
1 : DAUGHTER CARD
2, 3 : CONNECTOR
4 : MOTHER BOARD
5 : CHASSIS
6, 7, 16, 17 : GUIDING ELEMENT
8 : CEILING BOARD
11 : DIRECTION OF INSERTION
60, 70, 160, 170 : GUIDE PLANE

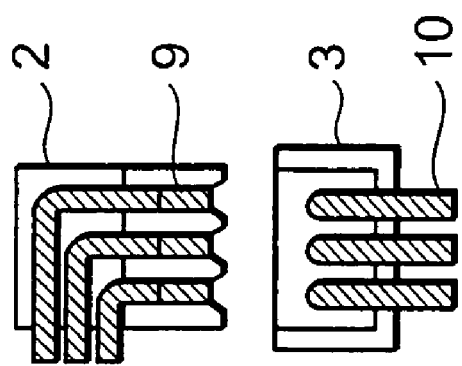
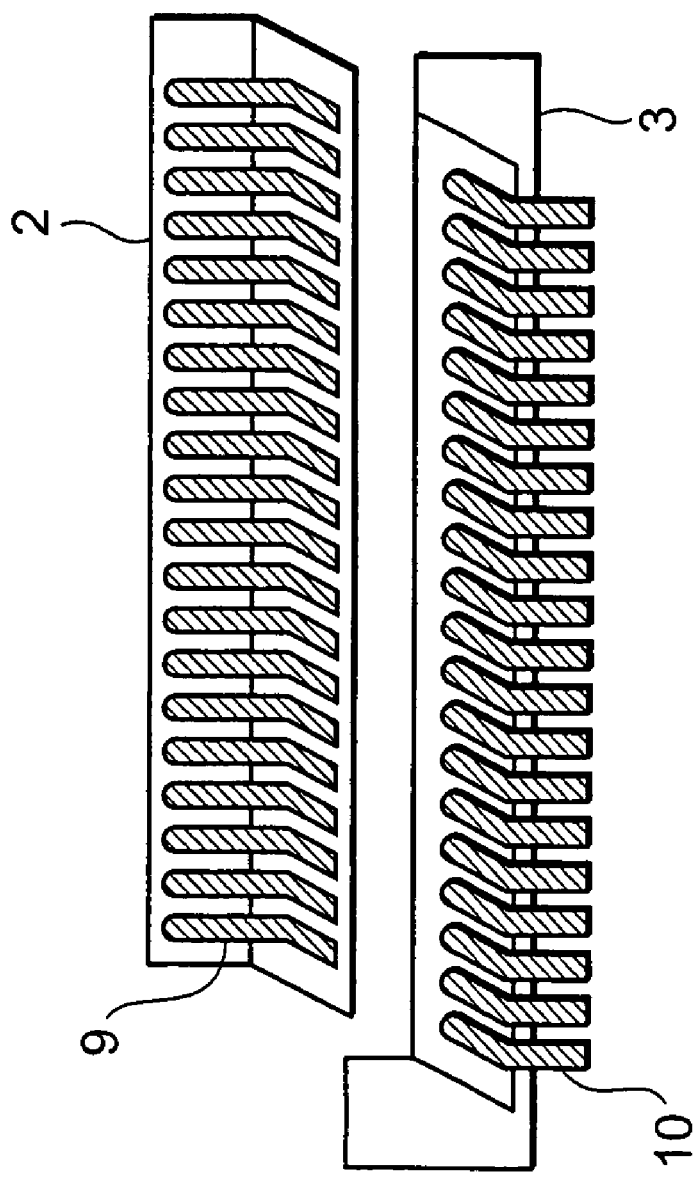
9, 10: TERMINAL

20 : GUIDE ELEMENT
171 : UPPER GUIDE PLANE
172 : LOWER GUIDE PLANE

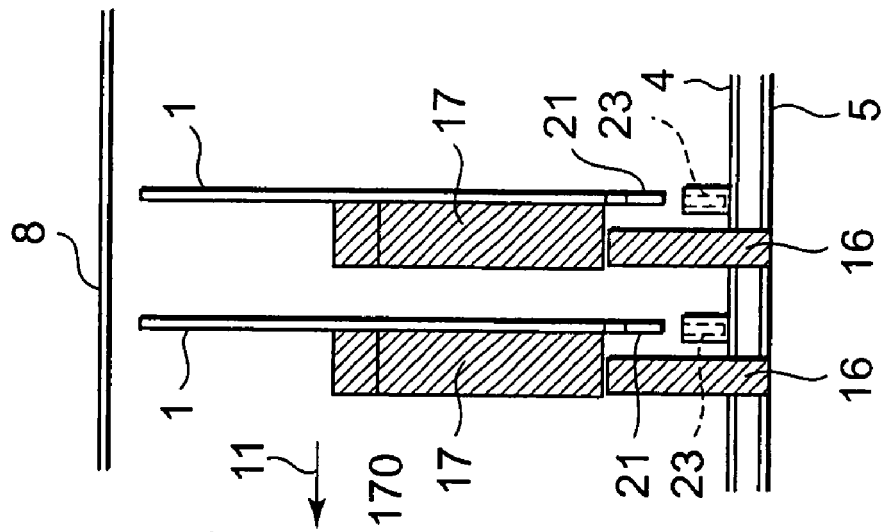
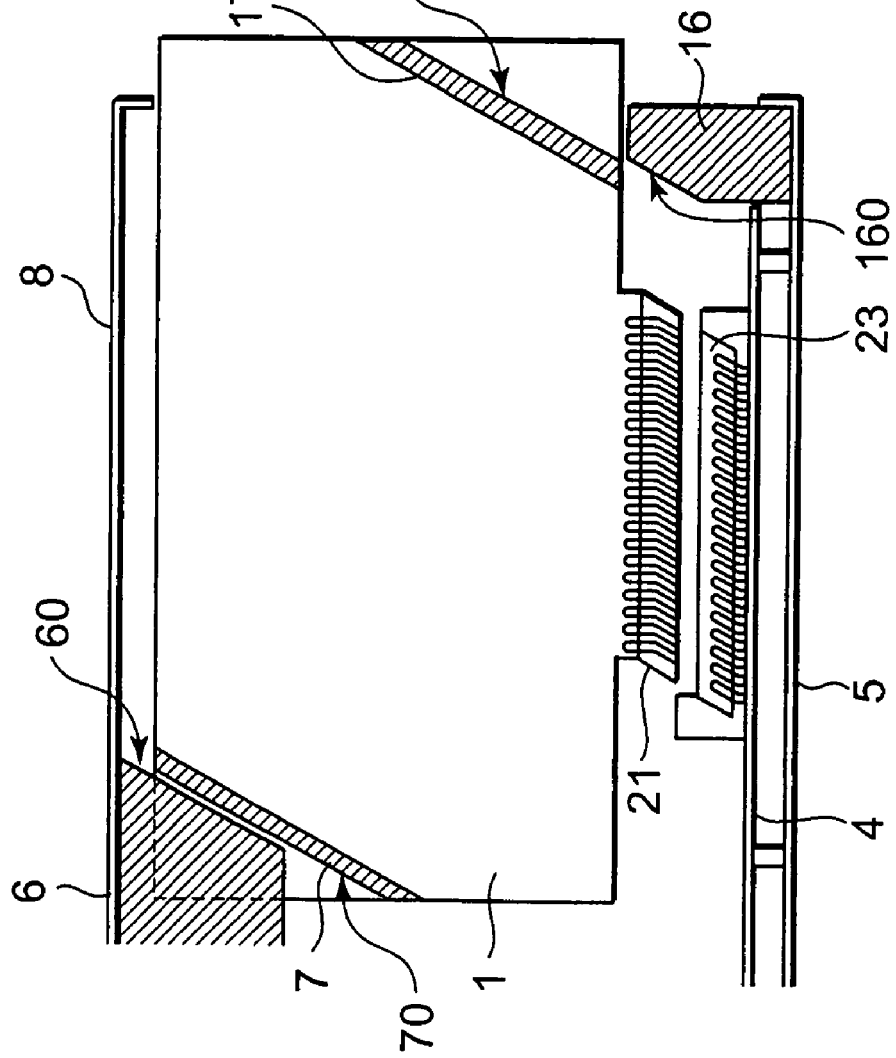

25, 26 : SLOT
27 : PROJECTION
28 : GUIDING PART

40 : MOTHER BOARD
41 : CHASSIS
42 : CONNECTOR

50 : DAUGHTER CARD
51 : CONNECTOR
52 : CEILING BOARD
53 : SCREW

70 : OBJECT UNIT
80 : ANOTHER UNIT
90 : RACK

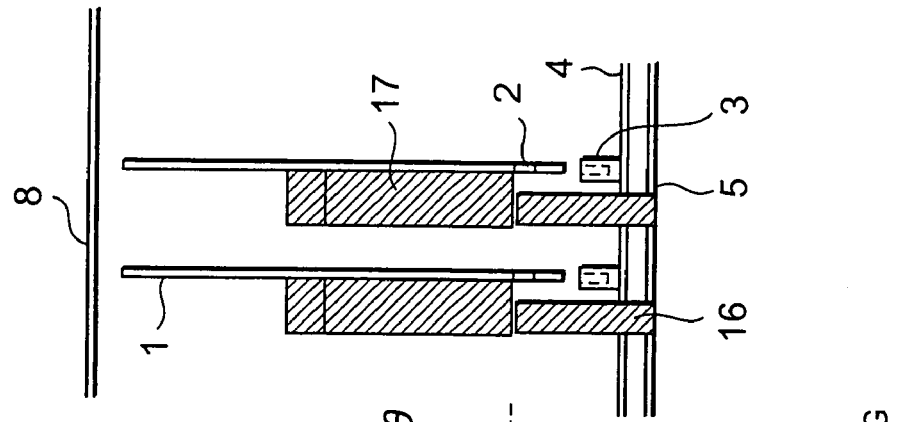
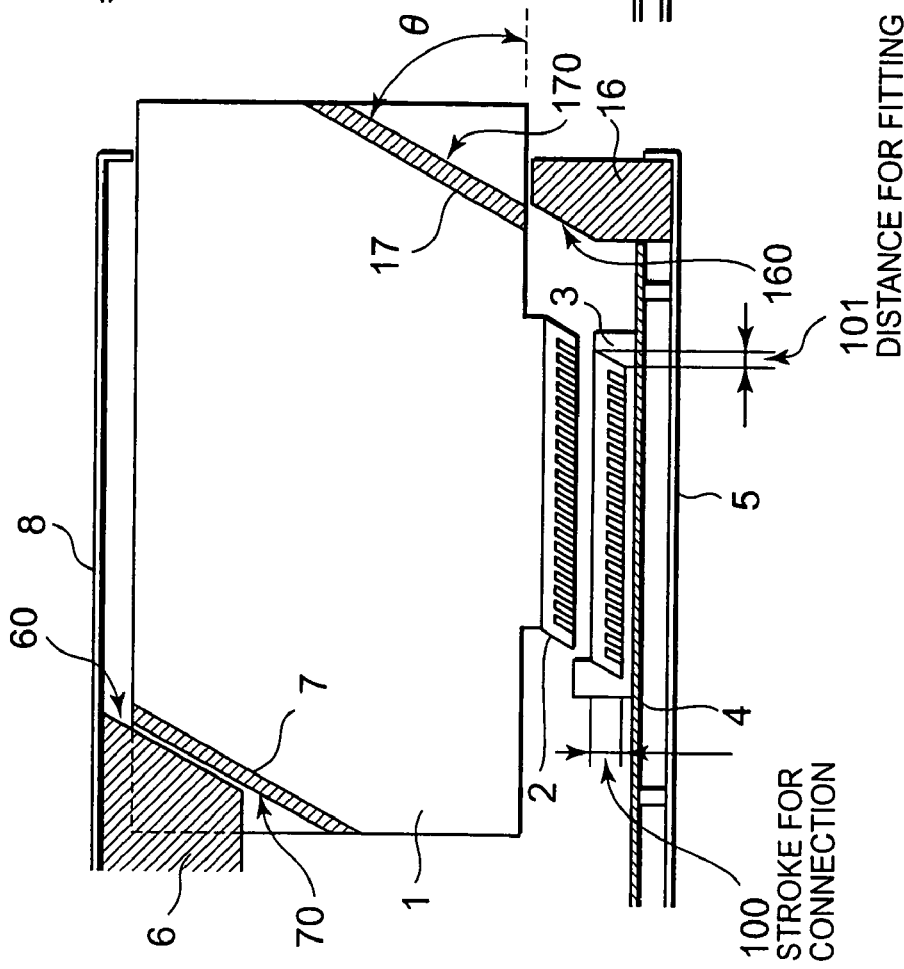
Fig. 10A SIDE VIEW (SECTIONAL VIEW)
Fig. 10B FRONT VIEW

FRONT VIEW

SIDE VIEW (SECTIONAL VIEW)

FRONT VIEW

SIDE VIEW (SECTIONAL VIEW)

APPARATUS INCLUDING CARD ELEMENT, DEVICE INSERTED INTO APPARATUS AND A METHOD FOR CONNECTING OR DISCONNECTING THE CARD ELEMENT

BACKGROUND OF THE INVENTION

The present invention relates to an apparatus for connecting a card element to a mother board removably through a connector and a method for connecting or disconnecting the card element.

A computer system includes one or more printed wiring substrates and those substrates are generally referred to as mother boards. A mother board includes a CPU (Central Processing Unit), a memory, etc. In many cases, one or more additional circuit boards can be connected to the mother board. Consequently, the computer system can have additional functions that are not provided as standard functions. For example, a PC (Personal Computer) has an extension slot in which an extension card can be fitted. Sometimes, the extension card specific to the mother board is referred to as a daughter card. The daughter card accesses components of a mother board directly, not through a general extension bus that is slow in processing speed. The daughter card has an integrated connector that is connected to its corresponding integrated connector of the mother board.

FIG. 7 shows an example of how a mother board 40 is disposed flatly at the bottom of a unit chassis 41. In case where the mother board 40 has so many components, it should be placed flatly to increase a board area. The mother board 40 includes a plurality of connectors 42 that has a linear structure and disposed in parallel with each another. Those connectors 42 are all connected to the mother board 40 electrically. The unit chassis 41 has side walls except an opening and a ceiling board, so that the mother board 40 looks like being housed in a case.

Generally, the daughter card is a rectangular circuit board comparatively small in size and has a connector along its one side edge. This connector is inserted into its corresponding connector of the mother board, thereby the daughter card is connected electrically to the mother board of the computer.

To connect or disconnect the daughter card to the mother board disposed as shown in FIG. 7, conventionally the screws 53 are removed from the ceiling board 52 of the unit chassis as shown in FIG. 8, then remove the ceiling board 52. In other words, to connect the connector 51 of the daughter card 50 to the connector 42 of the mother board 40, the daughter card 50 must be disposed above the motherboard 40 and inserted or removed vertically with respect to the mother board 40.

In Toku-hyou (National Publication) No. 2002-512454, a device enabling a circuit card to be connected removably to a mother board in a situation as shown in FIG. 7 is disclosed. According to the technique disclosed in the patent document, the device is provided with a supporting structure body for supporting the circuit card and moving the circuit card to a predetermined position in a direction horizontally to the mother board and an actuator for moving the circuit card in a direction perpendicularly to the mother board, thereby a connecting part of the circuit card is connected to a connector of the mother board removably without removing a ceiling board of the chassis in which the mother board is housed.

On the other hand, in Laid-Open No. 1999-340660, an inserting or removing mechanism for inserting or removing an extension board in or from a mother board without opening a case in which the mother board is disposed. According to the mechanism disclosed in the patent document, a plurality of guides are provided to move the extension board in a direction perpendicularly to the direction for inserting or removing the mother board and specially one of those guides for supporting the extension board from below is provided with a spring for supporting and pushing up the guide. And two levers, one for inserting the extension board into the connector and the other for taking out the extension board from the connector are provided to enable the extension board to be moved in the inserting or removing direction.

SUMMARY OF THE INVENTION

However, the above described conventional techniques have following problems.

As shown in FIG. 7, because the mother board 40 is housed in the unit chassis 41, the ceiling board of the chassis 41 must be removed to insert or remove the daughter card as shown in FIG. 8. This has been troublesome.

In addition, as shown in FIG. 9, when using a PC or the like, a plurality of units are often disposed in a rack 90 to reduce a disposition space. In FIG. 9, a unit 80 is disposed above another unit 70. In such a case, the unit 70 must be pull out from the rack 90 to open the upper cover of the unit 70. In case where the daughter card must be inserted or removed while the power is turned on (hot swap), a replacement of the daughter card is impossible, since the ceiling board cannot be removed.

According to the technique disclosed in the above mentioned patent documents, although the extension card can be inserted or removed without opening the chassis, the device must be provided with an additional mechanism for changing a movement of the extension card, so a structure becomes complicated.

Under such circumstances, it is an object of the present invention to provide an apparatus for connecting or disconnecting a card element to or from a substrate without opening the top cover of the chassis in which the substrate is disposed and a method for connecting or disconnecting the card element.

An apparatus including a substrate and a card element to be installed on the substrate includes a first plane which inclines at a predetermined angle with respect to the substrate; a second plane which is provided on the card element, inclines at the angle with respect to the substrate, and slides on the first plane in a direction corresponding to the angle; a first terminal which is provided on the substrate, and inclines at the angle with respect to the substrate; and a second terminal which is provided on the card element, inclines at said angle with respect to said substrate, and connects with the first terminal.

An apparatus including a substrate and a card element to be installed on the substrate includes a first plane which inclines at a predetermined angle with respect to the substrate; a second plane which is provided on the card element, inclines at the angle with respect to the substrate, and slides on the first plane in a direction corresponding to the angle; a third plane which inclines at the angle with respect to the substrate; a fourth plane which is provided on the card element, inclines at the angle with respect to the substrate, and slides on the third plane in a direction corresponding to the angle; a first terminal which is provided on the substrate, and inclines at the angle with respect to the substrate; and a second terminal which is provided on the card element, inclines at the angle with respect to the substrate, and connects with the first terminal.

A device which is inserted into an apparatus, and is installed on a substrate provided in the apparatus includes a first plane which inclines at a predetermined angle with respect to the substrate, and slides on a second plane provided at the apparatus in a direction corresponding to the angle; a first terminal which inclines at the angle with respect to the substrate, and connects with a second terminal provided at the substrate.

BRIEF DESCRIPTION OF THE DRAWINGS

Other features and advantages of the invention will be made more apparent by the following detailed description and the accompanying drawings, wherein:

FIG. 1A is a side view (cross sectional view) of an apparatus in a first exemplary embodiment of the present invention;

FIG. 1B is a front view of the apparatus in the first exemplary embodiment of the present invention;.

FIG. 2A is a side view (cross sectional view) of a connector in the first exemplary embodiment of the present invention;

FIG. 2B is a front view of the connector in the first exemplary embodiment of the present invention;

FIG. 4A is a side view (cross sectional view) of an apparatus in a third exemplary embodiment of the present invention;

FIG. 4B is a front view of the apparatus in the third exemplary embodiment of the present invention;

FIG. 10A is a side view (cross sectional view) of an apparatus in a first exemplary embodiment of the present invention;

FIG. 10B is a front view of the apparatus in the first exemplary embodiment of the present invention;

In the drawings, the same reference numerals represent the same structural elements.

DETAILED DESCRIPTION OF THE PREFERRED EMBODIMENTS

Figure 6:
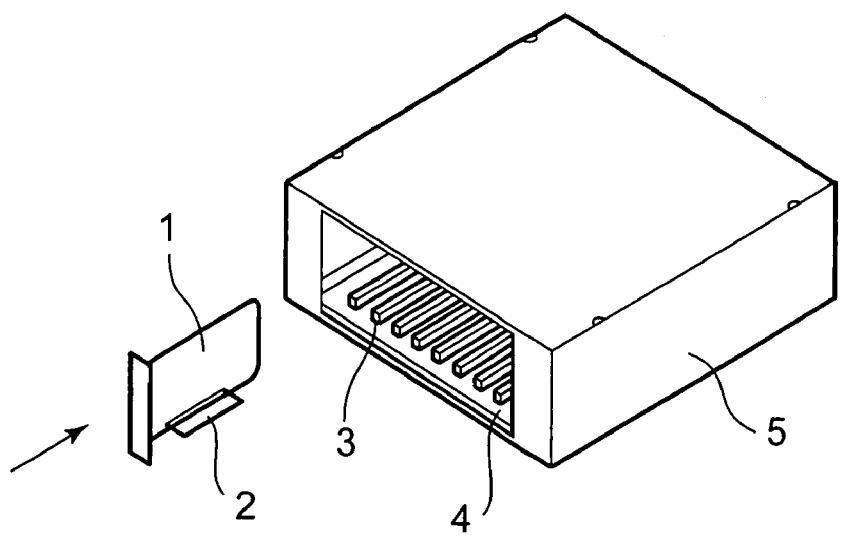
FIG. 6 is a perspective view describing how a daughter card is inserted into a mother board provided in a chassis.
Figure 7:
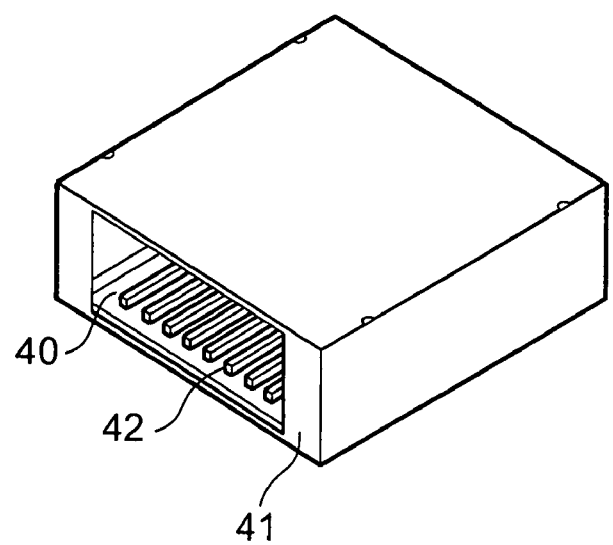
FIG. 7 is a perspective view of the mother board disposed in a chassis.
Figure 8:
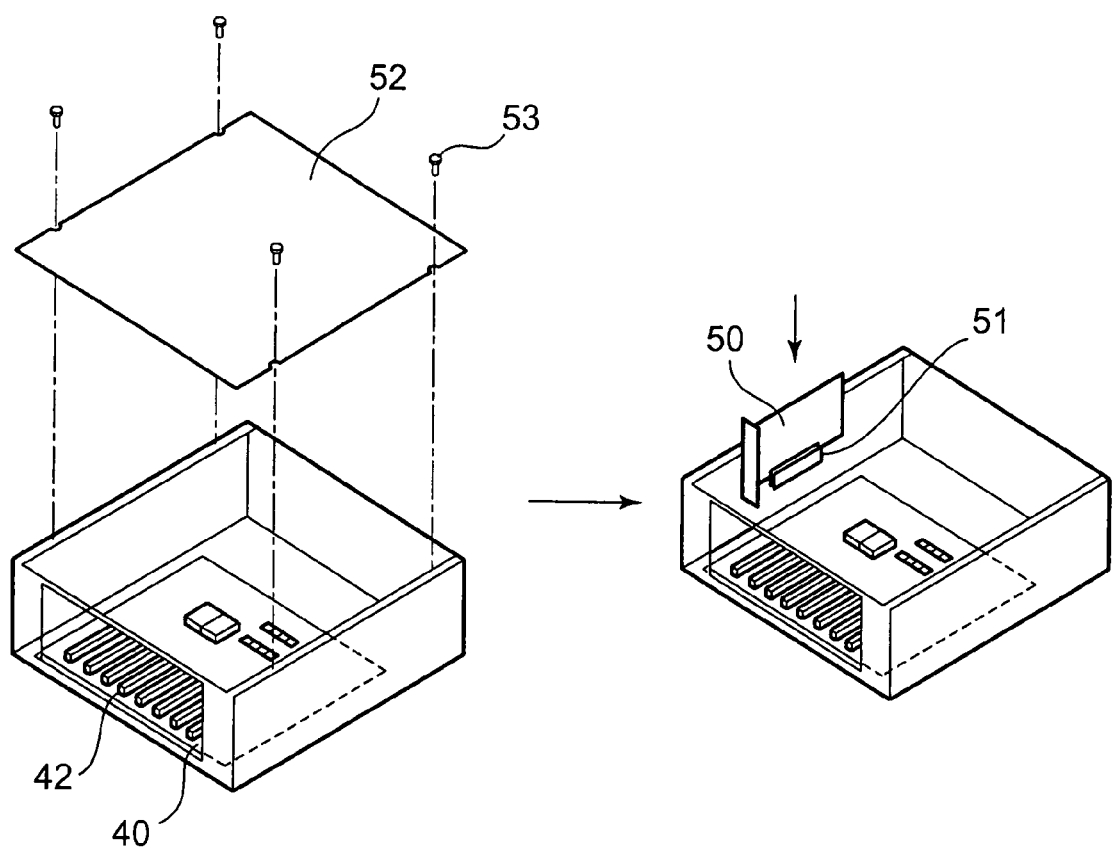
FIG. 8 is a perspective view describing how the daughter card is inserted into the mother board conventionally.
Figure 9:
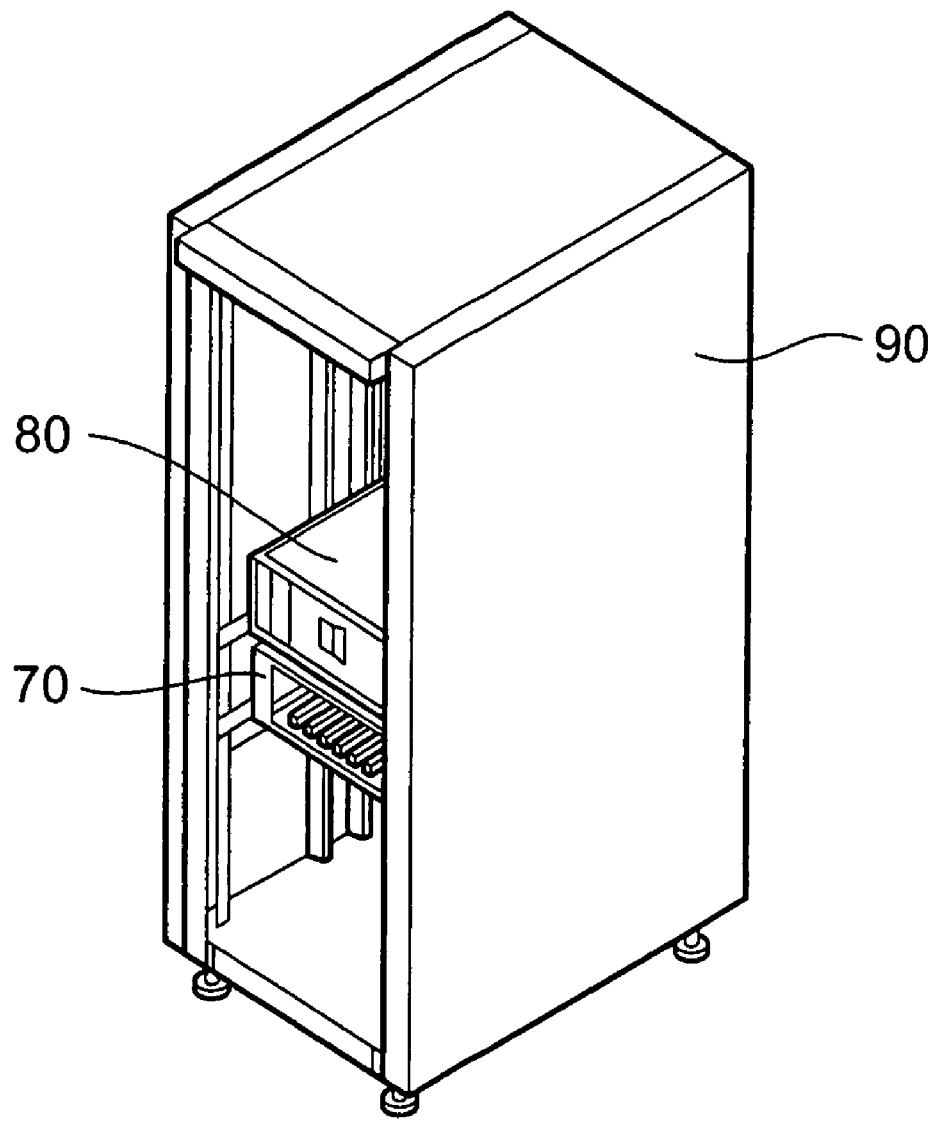
FIG. 9 is a perspective view of an object unit on which another unit is mounted.

Hereunder, exemplary embodiments of the present invention will be described in detail with reference to the accompanying drawings. At first, an apparatus in a first exemplary embodiment of the present invention will be described. FIG. 1A is a side view (cross sectional view) of the apparatus in the first exemplary embodiment of the present invention and FIG. 1B is a front view of the apparatus. FIG. 6 is a perspective view describing how a daughter card 1 is inserted into or removed from a mother board 4 disposed in a chassis 5.

As shown in FIG. 1A, the mother board 4 is disposed at the bottom of the chassis 5 and a connector 3 is installed on the mother board 4. The connector 3 is used for connecting the daughter card 4. The terminal of the connector 3 is formed like a comb and inclined at a predetermined angle θ with respect to the mother board 4. The chassis 5 has a guide element 16 including guide plane 160 inclined at the predetermined angle θ with respect to the mother board 4. In addition, the ceiling board of the chassis 5 has a guide element 6 including a guide plane 60 inclined substantially at the predetermined angle θ with respect to the mother board 4.

The daughter card 1 is, for example, a rectangular board and disposed in the chassis 5, and is substantially perpendicular to the mother board 4. A connector 2 is provided at the lower end of the daughter card 1 and the connector 2 has a comb-like terminal inclined substantially at the predetermined angle θ with respect to the mother board 4 so as to be connected to the terminal of the connector 3.

When the daughter card 1 is installed on the mother board 4, the daughter card 1 is inserted into the chassis 5 in a direction of insertion 11 that is substantially parallel with the mother board 4. A guide element 7 is provided at a front part of the daughter card 1. The front part corresponds to a front side for the direction of insertion 11. The guide element 7 includes a guide plane 70 inclined substantially at the predetermined angle θ with respect to the mother board 4. The guide element 6 and the guide element 7 come into contact with each other on their guide planes 60,70 when the daughter card 1 is inserted substantially parallel with the mother board 4 into the chassis 5. And then, the guide elements 6 and 7 slide on their guide planes 60,70 to guide the daughter card 1 downward obliquely to a direction corresponding to the predetermined angle θ. In addition, a guide element 17 is provided on a rear part of the daughter card 1. The rear part corresponds to a rear side for the direction of insertion 11. The guide element 17 includes a guide plane 170 inclined substantially at the predetermined angle θ with respect to the mother board 4. A guide element 16 is provided on the chassis 5. The guide element 16 includes a guide plane 160 inclined substantially at the predetermined angle with respect to the mother board 4. The guide element 16 and 17 slide on their guide planes 160,170 to guide the daughter card 1 downward obliquely to a direction corresponding to the predetermined angle θ.

FIG. 1B is a front view of the apparatus in the first exemplary embodiment, that is, when the apparatus is viewed from an opening of the chassis 5. As shown in FIG. 1B, the mother board 4 is disposed on the chassis 5 and two connectors 3 are provided on the mother board 4. The number of connectors 3 is not limited only to 2. The guide elements 16 are provided on the chassis 5. The guide elements 16 are adjacent to the corresponding connector 3, respectively. And a guide element 6 is provided at an inner surface of a ceiling board 8 of the chassis 5. Two daughter cards 1 are installed on the mother board 4 and a connector 2 is provided at the lower side of each daughter card 1, and the connector 2 is connected to the corresponding connector 3. The guide element 7 and 17 are provided at an opposite side of the one at which the connector 2 is provided. The guide element 7 and 17 come into contact with the guide element 6 and 16 on their guide planes, respectively.

Here, the connectors 2 and 3 are described in detail. FIG. 2A is a side view (cross sectional view) of the connector 2 and 3 in the first exemplary embodiment. As shown in FIG. 2A, the connector 2 has a comb-like terminal 9, and a tip part of the terminal 9 is inclined downward obliquely. As described above, the inclination angle corresponds to the predetermined angle θ with respect to the mother board 4. In the same way, the connector 3 also has a comb-like terminal 10 and inclined upward obliquely. As described above, the inclination angle corresponds to the predetermined angle θ with respect to the mother board 4. Each connection part of the terminal 9 is cylindrical shape, and the terminal 10 is connected to the connection terminal 9 so as to be fitted therein. FIG. 2B is a front view of the connector 2 and 3. As shown in FIG. 2B, because the connector 2 is formed at a side surface of the daughter card 1, the terminal 9 is bent at a substantially middle point of the terminal 9. On the other hand, the terminal 10 of the connector 3 is extended upward from the mother board 4.

Next, the procedures for inserting the daughter card 1 into the apparatus or removing the daughter card 1 from the apparatus will be described. At first, the procedures will be described referring to FIG. 6. As shown in FIG. 6, the mother board 4 on which the connector 3 is provided is disposed in the chassis 5 including a ceiling board. The connector 2 is provided at the lower end of the daughter card 1. The daughter card 1 is substantially perpendicular to the mother board 4. The mother board 4 is disposed horizontally on the chassis 5. The daughter card 1 is inserted into the chassis 5 through an opening formed at the front side (or rear side (not shown)) of the unit chassis 5. The daughter card 5 is inserted in a direction that is substantially parallel with the mother board 4.

The guide elements 6 and 7 come into contact with each other and slide on their guide planes 60, 70 respectively as shown in FIG. 1A, then the guide elements 6 and 7 slide on their guide planes 60,70 to guide the daughter card 1 downward obliquely to a direction corresponding to the predetermined angle θ. And, the guide elements 16 and 17 slide on their guide planes 160,170 to guide the daughter card 1 downward obliquely to a direction corresponding to the predetermined angle θ. After that, the connector 2 of the daughter card 1 guided downward obliquely is connected to the connector 3 of the mother board 4. By reversing the above procedures, the daughter card 1 is removed from the mother board 4. In other words, a force applied to the daughter card 1 horizontally is converted to a force working in an oblique direction due to the guide element inclined with respect to the mother board 4. As a result, the daughter card 1 is moved substantially perpendicularly to the mother board 4. Because the connectors 2 and 3 have the terminals 9 and 10 inclined at the same angle respectively, the connectors 2 and 3 can be connected or disconnected when the daughter card 1 is slid to a direction corresponding to the predetermined angle θ.

Thus, each connector has an inclined terminal and when the daughter card 1 is inserted into the chassis from its front side (or rear side) and kept being inserted as is, the connectors are slid along the guide elements to be connected with each other. When the connector is disconnected, the daughter card 1 is just pulled to the front side (or rear side). Thus the connector is disconnected.

Next, the effects of the first exemplary embodiment will be described. According to the first exemplary embodiment, the connectors including terminals inclined at the same angle are provided at the daughter card and at the mother board respectively, and two guide elements including guide plane inclined at the same angle are provided at the daughter card and at the chassis respectively. Therefore, the daughter card can be inserted or removed into or from the mother board without opening the ceiling board of the chassis. And, because the guide plane of each guide element is inclined as described above, a horizontal force applied to the daughter card when the daughter card is inserted into the chassis is converted to an obliquely directional force. In addition, because the substantially horizontal force is converted to the substantially obliquely directional force, therefore, no conventional complicated mechanism is required.

Figure 5:
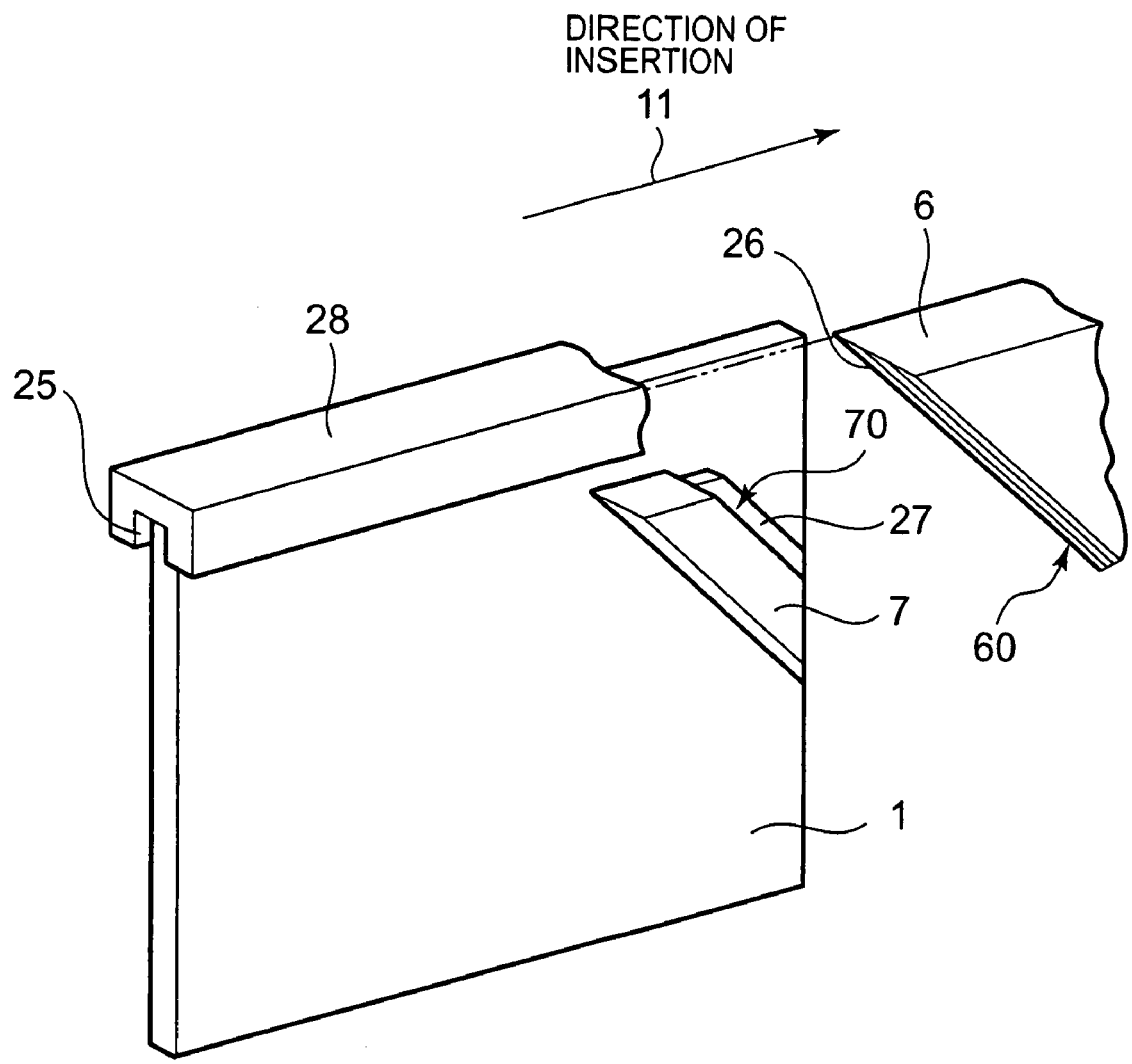
FIG. 5 is a perspective view of a guide element in a modification of the first exemplary embodiment.

Next, a modification of the first exemplary embodiment will be described. FIG. 5 is a perspective view of a structure of a guide element in the modification. As shown in FIG. 5, in the modification, a guide element 28 extended substantially linearly is provided at the inner surface of the ceiling board 8 (not shown in FIG. 5) of the chassis 5 (not shown in FIG. 5). And, a slot 25 extended in substantially parallel to a direction in which the guide element 28 is extended is formed at an underside of the guide element 28. A top edge of the daughter card 1 is fitted in the slot 25, then the top edge of the daughter card 1 is slid in the slot 25 to insert the daughter card 1 stably into the chassis 5.

The guide element 7 is provided at the daughter card 1, and the guide element 6 is at the ceiling board of the chassis 5. The guide planes 70,60 of those guide elements 7 and 6 are inclined substantially at the predetermined angle θ with respect to the mother board 4. As shown in FIG. 5, a projection 27 is formed at the guide plane 70 of the guide element 7. The projection 27 is extended linearly in a direction corresponding to the predetermined angle θ. And, a slot 26 is formed in the guide plane 60 of the guide element 6 of the ceiling board 8. The projection 27 is fitted in the slot 26. A top part of the guide element 7 does not reach the top edge of the daughter card 1. So, when the daughter card 1 is guided and moved along the guide element 28, the guide element 7 does not hit against the guide element 28. Although not shown here, guide elements 17 and 16 shown in FIG. 1 are provided at the daughter card 1 and at the bottom of the chassis 5 respectively. A projection and a slot are also formed at the guide elements 17 and 16 respectively.

The guide elements 28 and 6 are disposed so that the projection 27 is fitted in the slot 26 when the daughter card 1 is guided by the guide element 28. The other items including connectors, etc. in the configuration are the same as those in the configuration in the first exemplary embodiment. So, the description for them are omitted in FIG. 5.

Next, the procedures for inserting the daughter card 1 into the apparatus or removing the daughter card 1 from the apparatus will be described. The daughter card 1 whose position is perpendicular to the mother board 4 is inserted substantially parallel with the mother board 4 into the chassis 5. At that time, the top edge of the daughter card 1 is fitted in the slot 25, and the top edge of the daughter card 1 and the guide element 28 are slid together while the daughter card 1 is moved in parallel with the mother board 4. Then, the daughter card 1 is guided by the guide element 28, so that the projection 27 is fitted in the slot 26, thereby the guide plane 70 of the guiding part 7 comes into contact with the guide plane 60 of the guide element 6. After that, the daughter card 1 is kept forcing toward the direction of insertion 11 to slide the guide elements on their guide planes. Therefore, the daughter card 1 is guided downward obliquely in a direction corresponding to the predetermined angle θ. The same procedures are also applied to the guide element 17 and the guide element 16. Other procedures are the same as those in the first exemplary embodiment. And by reversing the above described procedures, the daughter card 1 is removed from the mother board 4.

Next, the effects of the modification of the first exemplary embodiment will be described. As described above, the projection 27 is formed at the guide plane 70 of the guide element 7, and the slot 26 is formed at the guide plane 60 of the guiding part 6. And the projection 27 is fitted in the slot 26. Therefore, the daughter card 1 is stably guided downward obliquely. And because the guide element 28 is provided at the ceiling board 8 of the chassis 5, the projection 27 is fitted in the slot 26 more easily. Other effects of this modification are the same as those in the first exemplary embodiment.

Figure 3A:
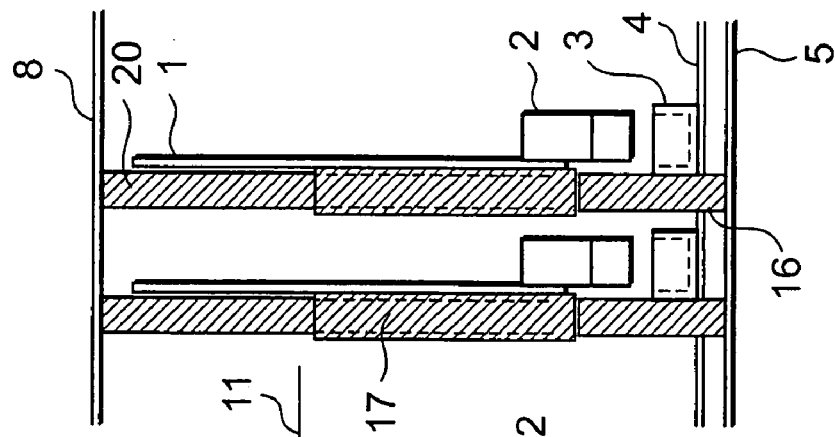
FIG. 3A is a side view (cross sectional view) of an apparatus in a second exemplary embodiment of the present invention.
Figure 3B:
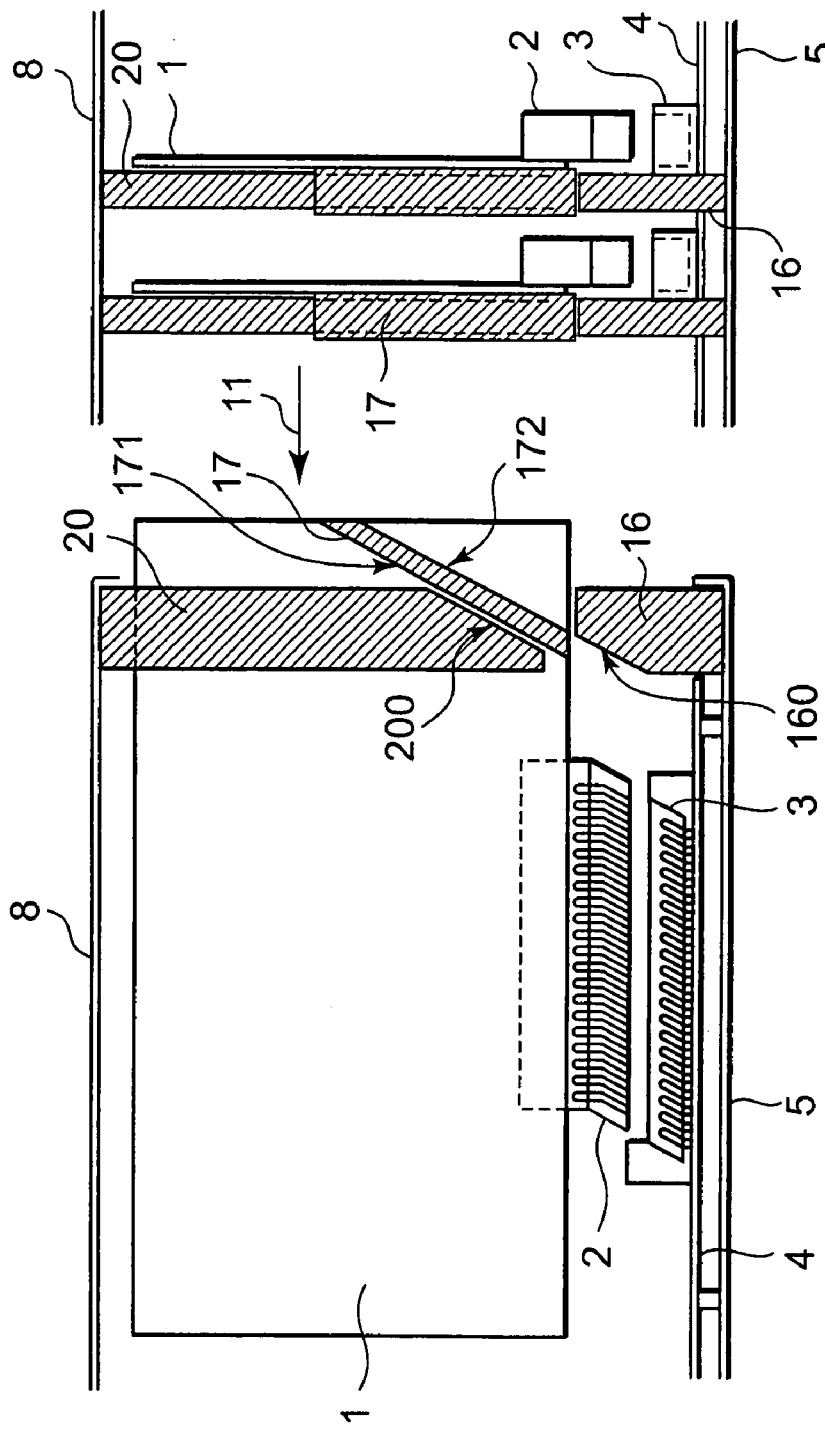
FIG. 3B is a front view of the device in the second exemplary embodiment of the present invention.

Next, an apparatus in a second exemplary embodiment of the present invention will be described. FIG. 3A is a side view (cross sectional view) of the apparatus in the second exemplary embodiment and FIG. 3B is a front view of the apparatus.

As shown in FIG. 3A, in the second exemplary embodiment, a disposition of the guide elements differs from those in the first exemplary embodiment. In other words, the daughter card 1 includes one guide element 17 and it is provided at a rear part of the daughter card 1. The rear part corresponds to a rear side for the direction of insertion 11. The guide element 17 includes two guide planes at an upper surface and a lower surface inclined substantially at the predetermined angle θ with respect to the mother board 4 respectively. The guide plane provided at the upper surface of the guide element 17 faces toward the top side of the daughter card 1. The guide plane provided at the lower surface of the guide element 17 faces toward the lower side of the daughter card 1. Hereunder, the guide plane provided at the upper surface of the guide element 17 is referred to as the upper guide plane 171, and the guide plane provided at the lower surface is referred to as the lower guide plane 172.

The guide element 16 is provided on the chassis 5. The guide element 16 is adjacent to an opening of the chassis 5. The guide element 16 includes a guide plane 160 inclined substantially at the predetermined angle θ with respect to the mother board 4. A guide element 20 is provided at the inner surface of the ceiling board 8. The guide element 20 is extended downward toward the lower surface of the chassis 5, and includes a guide plane 200 inclined substantially at the predetermined angle θ with respect to the mother board 4. As shown in FIG. 3A, when the daughter card is connected into the mother board 4 or is disconnected from the mother board 4, the upper guide plane 171 of the guide element 17 comes into contact with the guide plane 200 of the guide element 20, and the lower guide plane 172 of the guiding part 17 comes into contact with the guide plane 160 of the guide element 16, respectively. Thus the guide element 17 is put between the guide element 20 and the guide element 16, and is supported by the guide element 20 and the guide element 16. Other items in the second exemplary embodiment are the same as those in the first exemplary embodiment. Thus the same reference numerals are used for the same components and parts as those in the first exemplary embodiment, and the description for them will be omitted. This is also the same in the front view shown in FIG. 3B; all the items are the same as those in FIG. 1B except that the guide element 20 is provided above the guide element 16 and the guide element 17 is disposed between the guide parts 16 and 20.

Next, the procedures for inserting the daughter card 1 into the apparatus or removing the daughter card 1 from the apparatus will be described. The daughter card 1 is inserted substantially parallel with the mother board 4 into the chassis 5. When the daughter card 1 is inserted, the position of the daughter card 1 is substantially perpendicular to the mother board 4. The upper guide plane 171 of the guide element 17 comes into contact with the guide plane 200 of the guide element 20, then the guide elements 17 and 20 slide on their guide planes respectively to guide the daughter card 1 downward obliquely to a direction corresponding to the predetermined angle θ. After that, the lower guide plane 172 of the guide element 17 and the guide plane 160 of the guide element 16 of the chassis 5 slide respectively to guide the daughter card 1 downward obliquely to a direction corresponding to the predetermined angle θ. After that, the procedure for connecting the connector 2 and 3 is the same as those in the first exemplary embodiment. When the daughter card 1 is removed from the mother board 4, the lower guide plane 172 of the guide element 17 comes into contact with the guide plane 160 of the guide element 16, and then the guide elements 17 and 16 slide on their guide planes to guide the daughter card 1 upward obliquely to a direction corresponding to the predetermined angle θ. Then, the guide elements 17 and 20 slide on their guide planes to guide the daughter card 1 upward obliquely to a direction corresponding to the predetermined angle θ.

Next the effects of the second exemplary embodiment will be described. In the second exemplary embodiment, the daughter card 1 includes one guide element 17, and the structure of the daughter card 1 is more simple than that of the first exemplary embodiment. Thus, the manufacturing cost is reduced. Furthermore, in the first exemplary embodiment, the daughter card 1 includes two guide elements, and the chassis 5 also includes two guide elements. The size of the usable area of daughter card 1 may be limited. In the second exemplary embodiment, however, one guide element is provided. Therefore, a risk of being limited the usable area is decreased in the second exemplary embodiment.

In the second exemplary embodiment, the guide element 17 is provided at the rear part of the daughter card 1, and the guide elements 16 and 20 are provided at near the opening of the chassis 5. Those guide elements may also be provided in other places.

Next, an apparatus in a third exemplary embodiment of the present invention will be described. FIG. 4A is a side view (cross sectional view) of the apparatus in the third exemplary embodiment and FIG. 4B is a front view of the apparatus.

The third exemplary embodiment is characterized in that each connector of each daughter card 1 is a card edge type one. As shown in FIG. 4A, at the lower edge of each daughter card 1 is provided a connector 21. The connector 21 is formed at the lower edge of each card 1 as shown in the front view in FIG. 4B. On the other hand, the connector 2 in the first exemplary embodiment is formed at a side surface of the daughter card as shown in the front view in FIG. 1B. Other items except for the connector 21 in the third exemplary embodiment are the same as those in the first exemplary embodiment. In FIGS. 1A and 1B, therefore, the same reference numerals are used for the same components as those in the first exemplary embodiment and detailed description for them is omitted. In FIG. 4B, the guide elements 6 and 7 are omitted. The procedures for inserting the daughter card 1 into the apparatus or removing the daughter card 1 from the apparatus in the third exemplary embodiment are the same as those in the first exemplary embodiment. And the effects of the third exemplary embodiment are the same as those in the first exemplary embodiment. In addition, because the connector 21 is attached to the lower edge of each daughter card 1 and the thickness of the connector 21 is equal to that of the daughter card 1. Therefore, the space efficiency for attaching the daughter card 1 to the mother board 4 is improved.

As described above, in the third exemplary embodiment, the daughter card 1 is connected to the mother board 4. However, the present invention is not limited only to such a case; generally the present invention may also apply to a case in which, for example, a card element with circuit is connected to an apparatus with substrate including circuit. In addition, although the connecting method of the present invention is not limited only for electronic apparatuses, it may also apply preferably to a case in which a direction for inserting or removing a component is perpendicular to a direction for connecting or disconnecting a component.

Next, a setting for the predetermined angle θ is described bellow referring to FIG. 10.

As mentioned above, the predetermined angle θ of the guide planes of the guide element 6,7,16,17 and 20 is equal to the angle θ of the terminal 9 and 10. The angle θ is set based on a stroke for connection 100 (shown in FIG. 10) and a distance for fitting 101 (shown in FIG. 10). The stroke for connection 100 represents a necessary distance for connecting the terminal 9 with the terminal 10. The distance for fitting 101 represents a distance that is necessary for adding a force to connect the terminal 9 with the terminal 10.

A relation among the stroke for connection 100, the distance for fitting 101 and the predetermined angle θ is expressed by a following formula. The stroke for connection 100 is referred as "A", and the distance for fitting 101 is referred as "B".

$$\tan(\theta)=A/B.$$

The formula indicates that "B" becomes shorter as the predetermined angle θ becomes larger. In other words, "B" indicating the force for connecting the connector 2 and the connector 3 becomes shorter as the predetermined angle θ becomes larger. So, the force for connecting the connector 2 and the connector 3 becomes stronger as the predetermined angle θ becomes larger.

The formula indicates that "B" becomes longer as the predetermined angle θ becomes smaller. In other words, "B" indicating the force for connecting the connector 2 and the connector 3 becomes longer as the predetermined angle θ becomes smaller. So, the force for connecting the connector 2 and the connector 3 becomes weaker as the predetermined angle θ becomes smaller.

On the other hand, an area for providing the guide elements 6,7,16,17 and 20 on the daughter card 1 or the mother board 4 increases as the predetermined angle θ becomes smaller. So, an area of the daughter card 1 or the mother board 4 for installing components decreases.

Therefore, the predetermined angle θ is set so that the force for connecting the connectors and the area for providing the guide elements are optimized. For example, the force for connecting the connectors and the area for providing the guide elements may be optimized when the predetermined angle θ is set at around 45 degree to 60 degree.

Figure 11B:
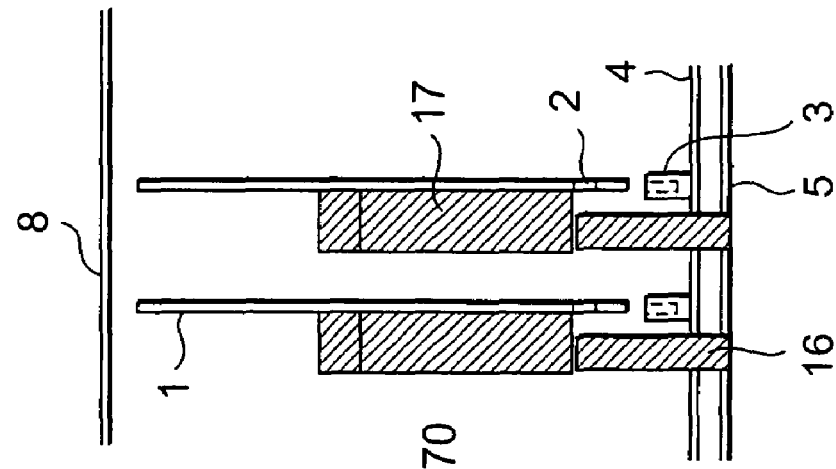
FIG. 11B is a front view of the apparatus in the first exemplary embodiment of the present invention.
Figure 11A:
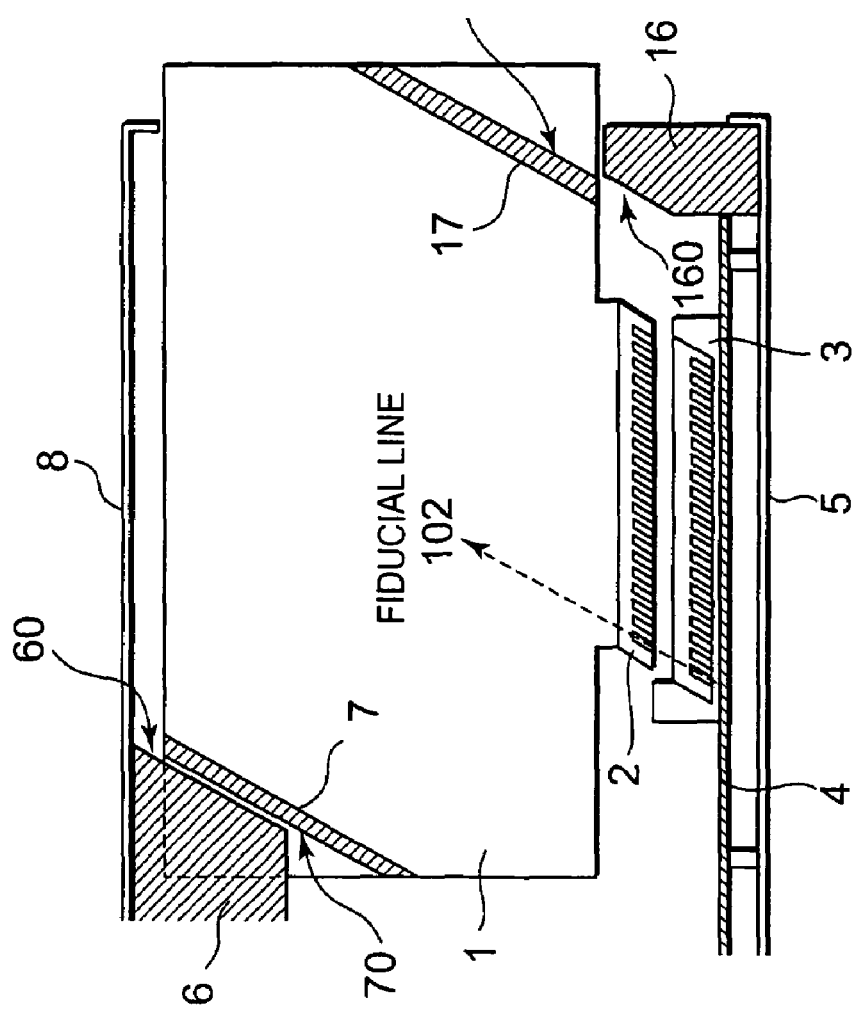
FIG. 11A is a side view (cross sectional view) of an apparatus in a first exemplary embodiment of the present invention.
Figure 12B:
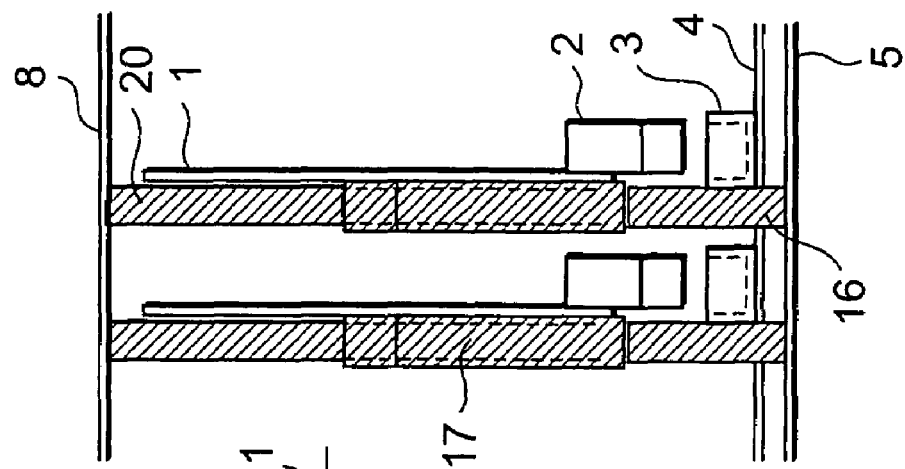
FIG. 12B is a front view of the device in the second exemplary embodiment of the present invention.
Figure 12A:
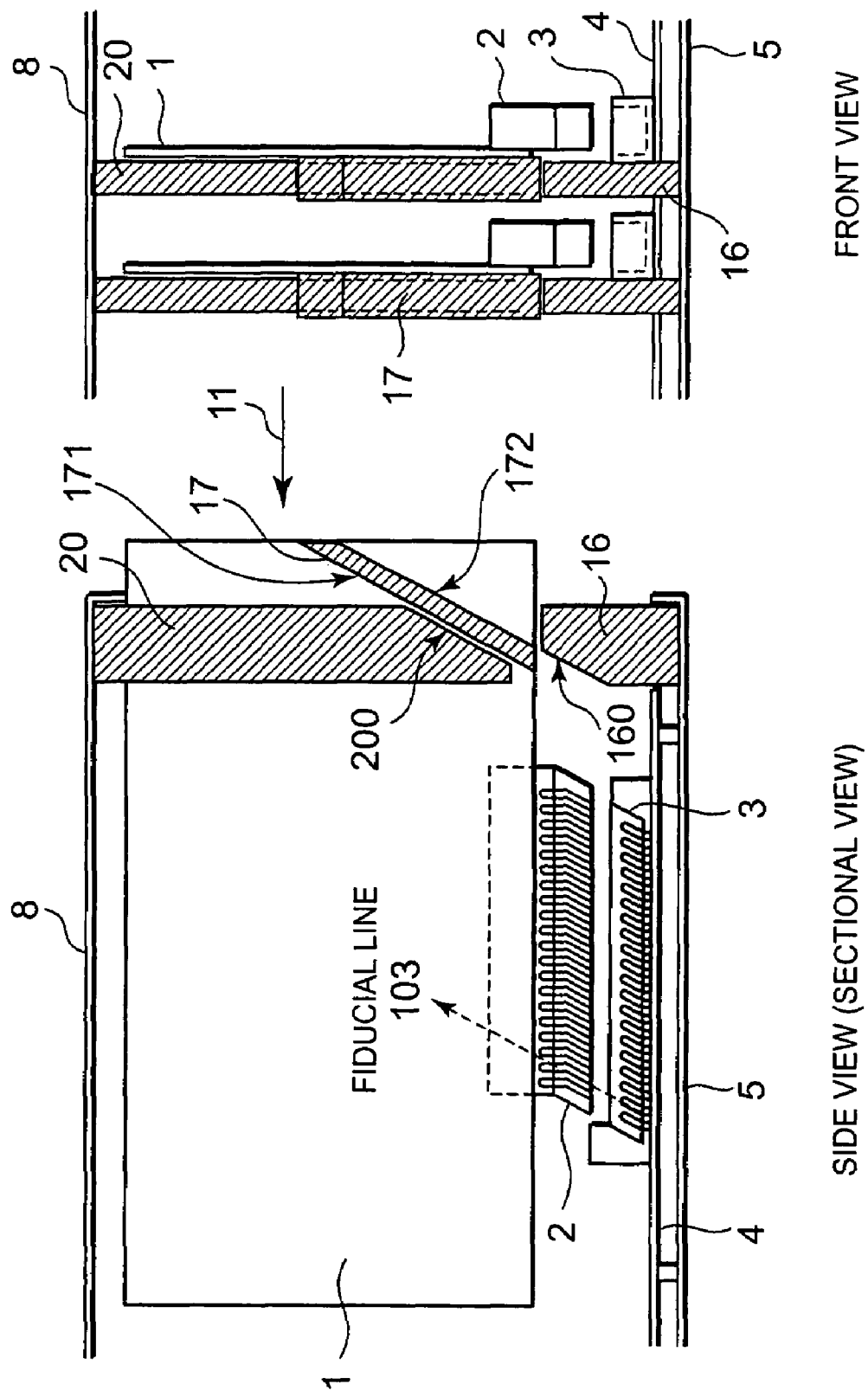
FIG. 12A is a side view (cross sectional view) of a connector in the second exemplary embodiment of the present invention.

Next, a setting for the guide elements 6,7,16,17 and 20 is described bellow referring to FIG. 11 and FIG. 12.

First, the setting for the guide elements 6,7,16,17 of the first exemplary embodiment is described. A fiducial line 102 is imaginarily drawn from one of the optionally selected terminal 10 along a direction corresponding to the predetermined angle θ, as shown in FIG. 11. A position where the terminal 9 corresponding to the optionally selected terminal 10 overlaps the fiducial line 102 is obtained. The guide elements 6 and 7 are provided so that the guide plane of the guide element 7 comes into contact with the guide plane of the guide element 6 at the position. The guide elements 16 and 17 are provided so that the guide plane of the guide elements 17 slides on the guide plane of the guide element 16 when the guide elements 6,7 slide on their guide planes and the guide elements 6,7 guide the daughter card 1 in a direction corresponding to the predetermined angle θ.

Second, the setting for the guide elements 16,17 and 20 of the second exemplary embodiment is described. A fiducial line 103 is imaginarily drawn from one of the optionally selected terminal 10 along a direction corresponding to the predetermined angle θ, as shown in FIG. 12. A position where the terminal 9 corresponding to the optionally selected terminal 10 overlaps the fiducial line 103 is obtained. The guide elements 17 and 20 are provided so that the upper guide plane of the guide element 17 comes into contact with the guide plane of the guide element 20 at the position. The guide element 16 is provided so that the lower guide plane of the guide elements 17 slides on the guide plane of the guide element 16 when the guide elements 17,20 slide on their guide planes and the guide elements 17,20 guide the daughter card 1 in a direction corresponding to the predetermined angle θ.

According to the present invention, therefore, the daughter card can be connected or disconnected to or from the mother board disposed in the chassis without opening the ceiling board of the chassis, since a connector including the terminal inclined substantially at the predetermined angle with respect to the mother board is provided at the daughter card and at the mother board respectively, and the guide element including the guide plane inclined substantially at the predetermined angle is provided at the daughter card and at the mother board respectively.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims. For example, this invention will now be applicable to not only the daughter card but also various card elements. And, for example, this invention will now be applicable to not only card element but also various other devices.

What is claimed is:

1. An apparatus including a substrate and a card element to be installed on said substrate, comprising:
   a first plane which inclines at a predetermined angle with respect to said substrate;
   a second plane which is provided on said card element, inclines at said angle with respect to said substrate, and slides on said first plane in a direction corresponding to said angle;
   a first terminal which is provided on said substrate, and inclines at said angle with respect to said substrate;
   a second terminal which is provided on said card element, inclines at said angle with respect to said substrate, and connected with said first terminal; and
   a chassis which houses said substrate; and
   wherein said card element is inserted into said chassis through its opening from a direction that is substantially parallel to said substrate.

2. An apparatus including a substrate and a card element to be installed on said substrate, comprising:
a first plane which inclines at a predetermined angle with respect to said substrate;
a second plane which is provided on said card element, inclines at said angle with respect to said substrate, and slides on said first plane in a direction corresponding to said angle;
a first terminal which is provided on said substrate, and inclines at said angle with respect to said substrate;
a second terminal which is provided on said card element, inclines at said angle with respect to said substrate, and connected with said first terminal;
a chassis which houses said substrate;
wherein said card element is inserted into said chassis through its opening from a direction that is substantially parallel to said substrate; and
a first guide element which is provided at said chassis, and includes said first plane.

3. An apparatus including a substrate and a card element to be installed on said substrate, comprising:
a first plane which inclines at a predetermined angle with respect to said substrate;
a second plane which is provided on said card element, inclines at said angle with respect to said substrate, and slides on said first plane in a direction corresponding to said angle;
a first terminal which is provided on said substrate, and inclines at said angle with respect to said substrate;
a second terminal which is provided on said card element, inclines at said angle with respect to said substrate, and connected with said first terminal;
a chassis which houses said substrate;
wherein said card element is inserted into said chassis through its opening from a direction that is substantially parallel to said substrate; and
a first guide element which is provided at a top plane of said chassis, and includes said first plane.

4. An apparatus including a substrate and a card element to be installed on said substrate, comprising:
a first plane which inclines at a predetermined angle with respect to said substrate;
a second plane which is provided on said card element, inclines at said angle with respect to said substrate, and slides on said first plane in a direction corresponding to said angle;
a first terminal which is provided on said substrate, and inclines at said angle with respect to said substrate;
a second terminal which is provided on said card element, inclines at said angle with respect to said substrate, and connected with said first terminal;
a guide slot which is substantially in parallel with said substrate; and
wherein the top end of said card element is fitted in said slot.

5. An apparatus including a substrate and a card element to be installed on said substrate, comprising:
a first plane which inclines at a predetermined angle with respect to said substrate;
a second plane which is provided on said card element, inclines at said angle with respect to said substrate, and slides on said first plane in a direction corresponding to said angle;
a first terminal which is provided on said substrate, and inclines at said angle with respect to said substrate;
a second terminal which is provided on said card element, inclines at said angle with respect to said substrate, and connected with said first terminal;
a projection which is formed on said second plane; and
a slot which is formed on said first plane, and is extended along an inclination of said first plane;
wherein said projection is fitted in said slot.

6. An apparatus including a substrate and a card element to be installed on said substrate, comprising:
a first plane which inclines at a predetermined angle with respect to said substrate;
a second plane which is provided on said card element, inclines at said angle with respect to said substrate, and slides on said first plane in a direction corresponding to said angle;
a first terminal which is provided on said substrate, and inclines at said angle with respect to said substrate;
a second terminal which is provided on said card element, inclines at said angle with respect to said substrate, and connected with said first terminal;
a projection which is formed on said first plane;
a slot which is formed on said second plane, and is extended along an inclination of said second plane; and
wherein said projection is fitted in said slot.

7. An apparatus including a substrate and a card element to be installed on said substrate, comprising:
a first plane which inclines at a predetermined angle with respect to said substrate;
a second plane which is provided on said card element, inclines at said angle with respect to said substrate, and slides on said first plane in a direction corresponding to said angle;
a third plane which includes at said angle with respect to said substrate;
a fourth plane which is provided on said card element, inclines at said angle with respect to said substrate, and slides on said third plane in a direction corresponding to said angle;
a first terminal which is provided on said substrate, and inclines at said angle with respect to said substrate;
a second terminal which is provided on said card element, inclines at said angle with respect to said substrate, and connects with said first terminal;
wherein said second plane is provided at a front part of said card element with respect to a direction from which said card element is inserted into said apparatus; and
wherein said fourth plane is provided at a rear part with respect to said direction from which said card element is inserted into said apparatus.

8. An apparatus including a substrate and a card element to be installed on said substrate, comprising:
a first plane which inclines at a predetermined angle with respect to said substrate;
a second plane which is provided on said card element, inclines at said angle with respect to said substrate, and slides on said first plane in a direction corresponding to said angle;
a third plane which includes at said angle with respect to said substrate;
a fourth plane which is provided on said card element, inclines at said angle with respect to said substrate, and slides on said third plane in a direction corresponding to said angle;
a first terminal which is provided on said substrate, and inclines at said angle with respect to said substrate;

a second terminal which is provided on said card element, inclines at said angle with respect to said substrate, and connects with said first terminal; and wherein said second terminal is provided on a plane of said card element opposite to a plane on which said second plane and said fourth plane is provided.

9. An apparatus including a substrate and a card element to be installed on said substrate, comprising:
   a first plane which inclines at a predetermined angle with respect to said substrate;
   a second plane which is provided on said card element, inclines at said angle with respect to said substrate, and slides on said first plane in a direction corresponding to said angle;
   a third plane which includes at said angle with respect to said substrate;
   a fourth plane which is provided on said card element, inclines at said angle with respect to said substrate, and slides on said third plane in a direction corresponding to said angle;
   a first terminal which is provided on said substrate, and inclines at said angle with respect to said substrate;
   a second terminal which is provided on said card element, inclines at said angle with respect to said substrate, and connects with said first terminal; and
   wherein said second plane and said fourth plane are provided on said card element at a rear part corresponding to a rear side for a direction from which said card element is inserted into said apparatus.

10. A device which is inserted into an apparatus, and is installed on a substrate provided in said apparatus, comprising:
    a first plane which inclines at a predetermined angle with respect to said substrate, and slides on a second plane provided at said apparatus in a direction corresponding to said angle;
    a first terminal which inclines at said angle with respect to said substrate, and connects with a second terminal provided at said substrate; and
    a projection which is formed on said first plane.

11. A device which is inserted into an apparatus, and is installed on a substrate provided in said apparatus, comprising:
    a first plane which inclines at a predetermined angle with respect to said substrate, and slides on a second plane provided at said apparatus in a direction corresponding to said angle;
    a first terminal which inclines at said angle with respect to said substrate, and connects with a second terminal provided at said substrate;
    a third plane which inclines at said angle with respect to said substrate, and slides on a fourth plane provided at said apparatus;
    wherein said first plane is provided at a front part with respect to a direction from which said device is inserted into said apparatus; and
    wherein said third plane is provided at a rear part with respect to said direction from which said device is inserted into said apparatus.

12. A method, comprising:
    providing a substrate provided on an apparatus, a card element to be installed on substrate, a first terminal provided on said substrate and inclined at a predetermined angle with respect to said substrate, a second terminal provided on said card element and inclined at said angle with respect to said substrate;
    wherein said apparatus includes a first plane inclined at said angle with respect to said substrate;
    wherein said card element includes a second plane inclined at said angle with respect to said substrate;
    inserting said card element into said apparatus in substantially parallel direction with respect to said substrate so that said second plane comes into contact with said first plane;
    guiding said card element in a direction corresponding to said angle by getting said second plane to slide on said first plane; and
    connecting said second terminal with said first terminal in said direction corresponding to said angle.

13. The method according to claim 12, further comprises:
    wherein said apparatus includes a third plane inclined at said angle with respect to said substrate;
    wherein said card element includes a fourth plane inclined at said angle with respect to said substrate;
    guiding said card element in said direction corresponding to said angle by getting said fourth plane to slide on said third plane.

14. The method according to claim 13, wherein said method further comprises:
    disconnecting said second terminal from said first terminal in said direction corresponding to said angle so that said fourth plane comes into contact with said third plane; and
    guiding said card element in said direction corresponding to said by getting said fourth plane to slide on said third plane.

15. A device which is inserted into an apparatus, and is installed on a substrate provided in said apparatus, said apparatus includes a chassis that houses said substrate, comprising:
    a first plane which inclines at a predetermined angle with respect to said substrate, and slides on a second plane provided at said apparatus in a direction corresponding to said angle;
    a first terminal which inclines at said angle with respect to said substrate, and connects with a second terminal provided at said substrate; and
    wherein said device is inserted into said chassis through its opening from a direction that is substantially parallel to said substrate.

* * * * *